US010651193B2

(12) United States Patent
Xiao et al.

(10) Patent No.: US 10,651,193 B2
(45) Date of Patent: May 12, 2020

(54) MEMORY DEVICE AND FORMING METHOD THEREOF

(71) Applicant: Yangtze Memory Technologies Co., Ltd., Wuhan, Hubei (CN)

(72) Inventors: Li Hong Xiao, Hubei (CN); EnBo Wang, Hubei (CN); Zhao Hui Tang, Hubei (CN); Qian Tao, Hubei (CN); Yu Ting Zhou, Hubei (CN); Sizhe Li, Hubei (CN); Zhaosong Li, Hubei (CN); Sha Sha Liu, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/047,308

(22) Filed: Jul. 27, 2018

(65) Prior Publication Data

US 2019/0378853 A1 Dec. 12, 2019

Related U.S. Application Data

(63) Continuation of application No. PCT/CN2018/090852, filed on Jun. 12, 2018.

(51) Int. Cl.
*H01L 29/76* (2006.01)
*H01L 27/11582* (2017.01)
(Continued)

(52) U.S. Cl.
CPC .. *H01L 27/11582* (2013.01); *H01L 21/02167* (2013.01); *H01L 21/02274* (2013.01);
(Continued)

(58) Field of Classification Search
None
See application file for complete search history.

(56) References Cited

U.S. PATENT DOCUMENTS 6,495,425 B1 12/2002 Chiang
9,129,859 B2 9/2015 Liu et al.
(Continued)

FOREIGN PATENT DOCUMENTS

CN 101236928 A 8/2008
CN 102194826 A 9/2011
(Continued)

OTHER PUBLICATIONS

International Search Report and Written Opinion of the International Searching Authority directed to related International Patent Application No. PCT/CN2018/090852, dated Mar. 6, 2019; 9 pages.

*Primary Examiner* — Calvin Y Choi
(74) *Attorney, Agent, or Firm* — Sterne, Kessler, Goldstein & Fox P.L.L.C.

(57) ABSTRACT

Methods and structures of a three-dimensional memory device are disclosed. In an example, the memory device includes a first alternating conductor/dielectric stack disposed on the substrate and a layer of silicon carbide disposed over the first alternating conductor/dielectric stack. A second alternating conductor/dielectric stack is disposed on the silicon carbide layer. The memory device includes one or more first structures extending orthogonally with respect to the surface of the substrate through the first alternating conductor/dielectric stack and over the epitaxially-grown material disposed in the plurality of recesses, and one or more second structures extending orthogonally with respect to the surface of the substrate through the second alternating conductor/dielectric stack. The one or more second structures are substantially aligned over corresponding ones of the one or more first structures.

22 Claims, 10 Drawing Sheets

(51) Int. Cl.
*H01L 21/02* (2006.01)
*H01L 21/324* (2006.01)
*H01L 21/768* (2006.01)
*H01L 23/522* (2006.01)
*H01L 23/528* (2006.01)
*H01L 23/532* (2006.01)
*H01L 23/00* (2006.01)
*H01L 27/11524* (2017.01)
*H01L 27/11556* (2017.01)
*H01L 27/1157* (2017.01)

(52) U.S. Cl.
CPC ...... *H01L 21/324* (2013.01); *H01L 21/76816* (2013.01); *H01L 21/76877* (2013.01); *H01L 23/5226* (2013.01); *H01L 23/5283* (2013.01); *H01L 23/5329* (2013.01); *H01L 23/53257* (2013.01); *H01L 23/562* (2013.01); *H01L 27/1157* (2013.01); *H01L 27/11524* (2013.01); *H01L 27/11556* (2013.01)

(56) References Cited

U.S. PATENT DOCUMENTS

| | | | |
|---|---|---|---|
| 9,356,033 B2 | 5/2016 | Son et al. | |
| 9,613,967 B1 | 4/2017 | Yi-Hao et al. | |
| 9,768,192 B1 | 9/2017 | Nakamura | |
| 2010/0109072 A1* | 5/2010 | Kidoh | H01L 27/0688 257/324 |
| 2011/0287612 A1* | 11/2011 | Lee | H01L 27/11565 438/478 |
| 2014/0054533 A1* | 2/2014 | Lee | H01L 45/00 257/2 |
| 2017/0352678 A1 | 12/2017 | Lu et al. | |
| 2017/0373078 A1 | 12/2017 | Chu et al. | |
| 2018/0315769 A1 | 11/2018 | Huo et al. | |

FOREIGN PATENT DOCUMENTS

| | | |
|---|---|---|
| CN | 104969351 A | 10/2015 |
| CN | 105261617 A | 1/2016 |
| CN | 107464817 A | 12/2017 |
| CN | 107579154 A | 1/2018 |
| CN | 107644837 A | 1/2018 |
| CN | 108565266 A | 9/2018 |
| WO | WO 2019037541 | 2/2019 |
| WO | WO 2019041956 A1 | 3/2019 |

* cited by examiner

MEMORY DEVICE AND FORMING METHOD THEREOF

CROSS REFERENCE TO RELATED APPLICATIONS

This application is a continuation of PCT Application No. PCT/CN2018/090852, filed on Jun. 12, 2018, the disclosure of which is incorporated by reference herein in its entirety.

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and fabrication methods therefore are disclosed herein. The disclosed structures and methods provide numerous benefits, including, but not limited to lower stress during fabrication and a lower bending of the layers during fabrication.

In some embodiments, a memory device includes a substrate having a plurality of recess in a surface of the substrate. An epitaxially-grown material is formed in the plurality of recesses. The memory device includes a first alternating conductor/dielectric stack disposed on the substrate and a layer of silicon carbide disposed over the first alternating conductor/dielectric stack. A second alternating conductor/dielectric stack is disposed on the silicon carbide layer. The memory device includes one or more first structures extending orthogonally with respect to the surface of the substrate through the first alternating conductor/dielectric stack and over the epitaxially-grown material disposed in the plurality of recesses, and one or more second structures extending orthogonally with respect to the surface of the substrate through the second alternating conductor/dielectric stack. The one or more second structures are substantially aligned over corresponding ones of the one or more first structures.

In some embodiments, the one or more first structures includes one or more NAND strings.

In some embodiments, the one or more second structures includes one or more NAND strings.

In some embodiments, each of the one or more NAND strings includes an inner semiconductor channel and one or more outer dielectric layers.

In some embodiments, the one or more outer dielectric layers includes at least one oxide layer and at least one nitride layer.

In some embodiments, the silicon carbide layer includes one or more doped regions substantially aligned over the one or more first structures.

In some embodiments, the one or more doped regions are doped with carbon.

In some embodiments, the silicon carbide layer has a thickness between 10 nm and 500 nm.

In some embodiments, the first layer stack and the second layer stack each include alternating layers of oxide and tungsten.

In some embodiments, the first layer stack and the second layer stack are arranged in a staircase pattern.

In some embodiments, a method for forming a memory device includes forming a first alternating sacrificial dielectric stack over a substrate, and forming one or more first openings through the first alternating sacrificial dielectric stack, the one or more first openings forming corresponding recesses in the substrate. The method includes forming a material in the corresponding recesses and forming one or more first vertical structures in the one or more first openings. The method further includes forming a silicon carbide layer over the first alternating sacrificial dielectric stack. The method also includes forming a second alternating sacrificial dielectric stack over the silicon carbide, and forming one or more second openings through the second alternating sacrificial dielectric stack. The one or more second openings are aligned with the one or more first vertical structures. The method also includes forming one or more second vertical structures in the one or more second openings.

In some embodiments, forming the material includes forming epitaxially grown silicon in the corresponding recesses.

In some embodiments, the method further includes, removing the sacrificial layers from the first layer stack and the second layer stack, and replacing the removed sacrificial layers with conductive layers.

In some embodiments, the removing the sacrificial layers includes removing nitride layers from the first layer stack and the second layer stack, and wherein the replacing includes replacing the nitride layers with tungsten.

In some embodiments, the forming the one or more first vertical structures includes forming one or more NAND strings.

In some embodiments, forming the one or more second vertical structures includes forming one or more NAND strings.

In some embodiments, forming the one or more NAND strings of the first and second vertical structures includes forming one or more outer dielectric layers and forming a semiconductor channel.

In some embodiments, the forming one or more outer dielectric layers includes forming at least one oxide layer and at least one nitride layer.

In some embodiments, forming the silicon carbide layer includes doping one or more regions of the silicon carbide layer, the one or more regions being substantially aligned over corresponding ones of the one or more first vertical structures.

In some embodiments, the doping includes doping the one or more regions of the silicon carbide layer with carbon.

In some embodiments, forming the silicon carbide layer includes forming the silicon carbide layer using plasma-enhanced chemical vapor deposition (PECVD).

In some embodiments, the method includes annealing the memory device after forming the silicon carbide layer.

The three-dimensional memory device provided by the present disclosure is fabricated using a process that reduces stress and strain on the stacked layers during the fabrication process. The fabrication of multiple gate layers is performed in two separate stages, with NAND strings being formed in a stacked configuration between the two stages, according to an embodiment. After completing the first stage, a layer of silicon carbide (SiC) is deposited over the structure, before commencing with the second stage of the fabrication. Accordingly, the layer of SiC may be present at about mid-depth of the memory device over the substrate. By forming the SiC layer between the two fabrication stages, the tensile stress of the added SiC layer counteracts the compressive stress of the substrate.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

Figure 1:
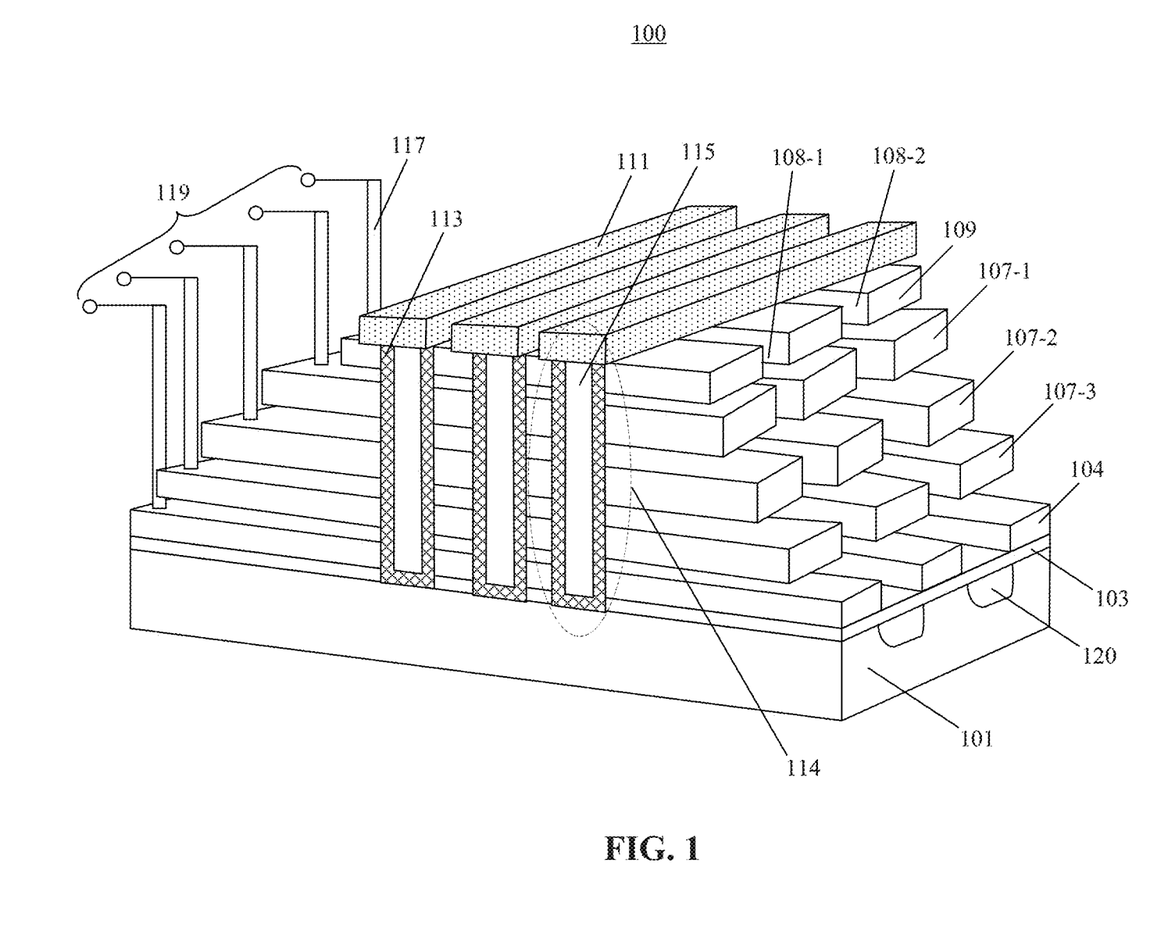
FIG. 1 is an illustration of a three-dimensional memory device.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity, but are discussed in more detail with reference to later figures.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. The structures 200-800 illustrated in FIG. 2 to FIG. 8 are each part of a three-dimensional NAND memory device. Other parts of the memory device are not shown for ease of description. Although using a three-dimensional NAND device as an example, in various applications and designs, the disclosed structure can also be applied in similar or different semiconductor devices to, e.g., reduce the number of metal connections or wiring. The specific application of the disclosed structure should not be limited by the embodiments of the present disclosure. For illustrative purposes, word lines and gate electrodes are used interchangeably to describe the present disclosure.

FIGS. 2-8 illustrate cross section views (e.g., along the X-axis) of various fabrication stages of an example NAND memory device, according to some embodiments.

Figure 2:
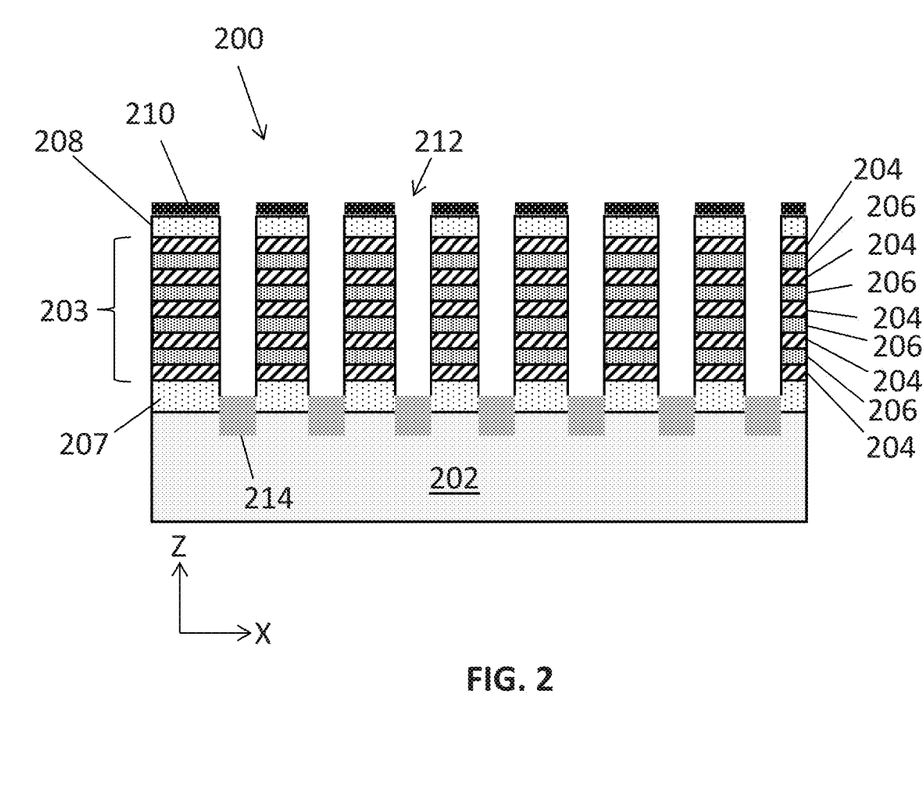
FIG. 2 illustrates a side cross-section view of a three-dimensional memory structure at a stage of an exemplary fabrication process, according to some embodiments.

FIG. 2 illustrates an exemplary structure 200 for forming a three-dimensional memory structure, according to some embodiments. In some embodiments, structure 200 includes a substrate 202. Substrate 202 can provide a platform for forming subsequent structures. Such subsequent structures are formed on a front (e.g., top) surface of substrate 202. And such subsequent structures are said to be formed in a vertical direction (e.g., orthogonal to the front surface of substrate 202.) In FIG. 2, and for all subsequent illustrated structures, the X and Y directions are along a plane parallel to the front and back surfaces of substrate 202, while the Z direction is in a direction orthogonal to the front and back surfaces of substrate 202.

In some embodiments, substrate 202 includes any suitable material for forming the three-dimensional memory device. For example, substrate 202 can include silicon, silicon germanium, silicon carbide, silicon on insulator (SOI), germanium on insulator (GOI), glass, gallium nitride, gallium arsenide, and/or other suitable III-V compound.

In some embodiments, an alternating sacrificial/dielectric layer stack 203 is formed over substrate 202. In some embodiments, alternating sacrificial/dielectric layer stack 203 is formed over a bottom dielectric layer 207. The layer stack 203 includes dielectric layers 204 alternating with sacrificial layers 206. The formation of layer stack 203 can involve depositing sacrificial layers 206 to each have the same thickness or to have different thicknesses. Example thicknesses of sacrificial layers 206 can range from 20 nm to 500 nm. Similarly, dielectric layers 204 can each have the same thickness or have different thicknesses. Example thicknesses of dielectric layers 204 can range from 20 nm to 500 nm. Another dielectric material 208 is deposited over layer stack 203. Dielectric material 208 has the same material composition of dielectric layers 204, according to some embodiments.

The dielectric material of sacrificial layers 206 is different from the dielectric material of dielectric layers 204, according to an embodiment. For example, each of sacrificial layers 206 can be silicon nitride while each of dielectric layers 204 can be silicon dioxide. Other example materials for each of sacrificial layers 206 include poly-crystalline silicon, poly-crystalline germanium, and poly-crystalline germanium-silicon. The dielectric materials used for any of dielectric layers 204 or sacrificial layers 206 can include silicon oxide, silicon nitride, silicon oxynitride, or any combination thereof. Although only nine total layers are illustrated in layer stack 203, it should be understood that this is for illustrative purposes only and that any number of dielectric layers may be included in layer stack 203.

Layer stack 203 can include a portion having a staircase structure (not illustrated) where each of at least sacrificial layers 206 terminate at a different length in the horizontal 'x' direction. This staircase structure allows for electrical contact to connect each of the word lines of the memory device.

In some embodiments, a masking layer 210 is deposited over structure 200. Masking layer 210 can be nitride, or any other material having a large etch selectivity compared with dielectric material 208. Masking layer 210 can be patterned and used as a hard mask for the formation of one or more openings 212 etched through layer stack 203 and into a portion of substrate 202. One or more openings 212 can be formed using a deep reactive ion etching (DRIE) process or an inductively coupled plasma (ICP) process.

In some embodiments, an epitaxially grown material 214 is formed at the bottom of one or more openings 212. The epitaxially grown material can be epitaxially grown silicon.

It should be understood that one or more openings 212 are illustrated as having vertical sidewalls for ease of illustration only, and that one or more openings 212 can instead have sloped or tapered sidewalls.

Figure 3:
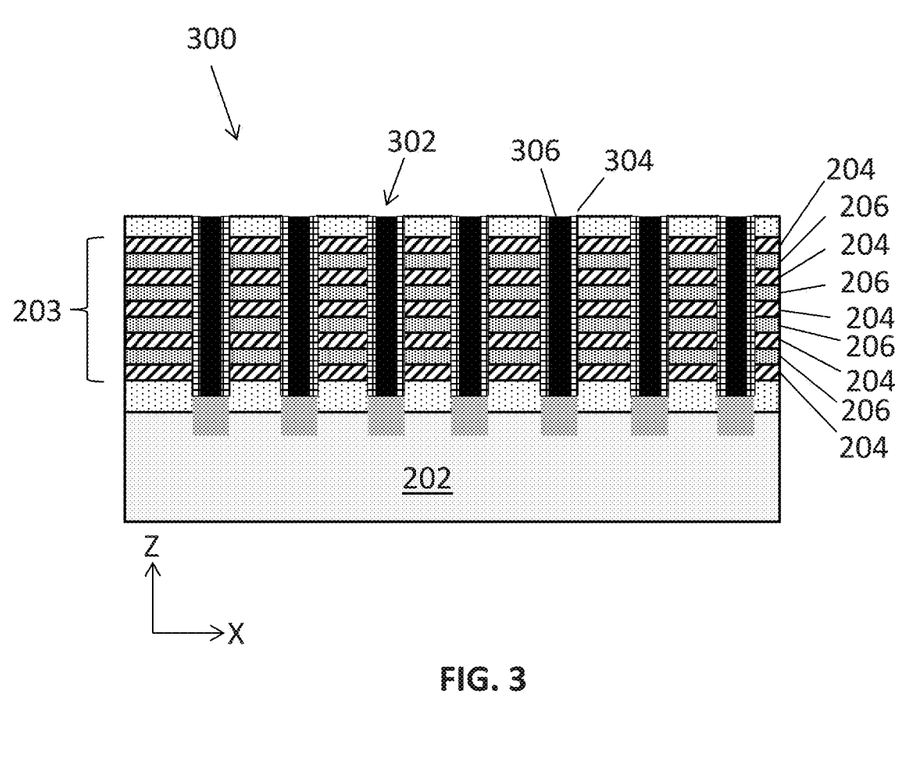
FIG. 3 illustrates a side cross-section view of a three-dimensional memory structure at a stage of an exemplary fabrication process, according to some embodiments.

FIG. 3 illustrates an exemplary structure 300 for forming the three-dimensional memory device, according to some embodiments. One or more first vertical structures 302 are formed within one or more openings 212. One or more first vertical structures 302 includes a plurality of memory layers 304 and an insulating core 306. According to some embodiments, one or more first vertical structures 302 are NAND strings.

Insulating core 306 can be any dielectric material, such as oxide, for example. Plurality of memory layers 304 can include a semiconductor channel layer, such as amorphous silicon, polysilicon, or single crystalline silicon. Plurality of memory layers 304 can also include a tunneling layer, a storage layer (also known as "charge trap/storage layer"), and a blocking layer. The semiconductor channel layer, the tunneling layer, the storage layer, and the blocking layer are arranged over one another on the sidewalls of one or more openings 212 in the order listed, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 304 includes silicon oxide/silicon nitride/silicon oxide (ONO) dielectrics (e.g., a tunneling layer including silicon oxide, a storage layer including silicon nitride, and a blocking layer including silicon oxide). Each layer of plurality of memory layers 304 can be deposited using any suitable thin film deposition technique.

Figure 4:
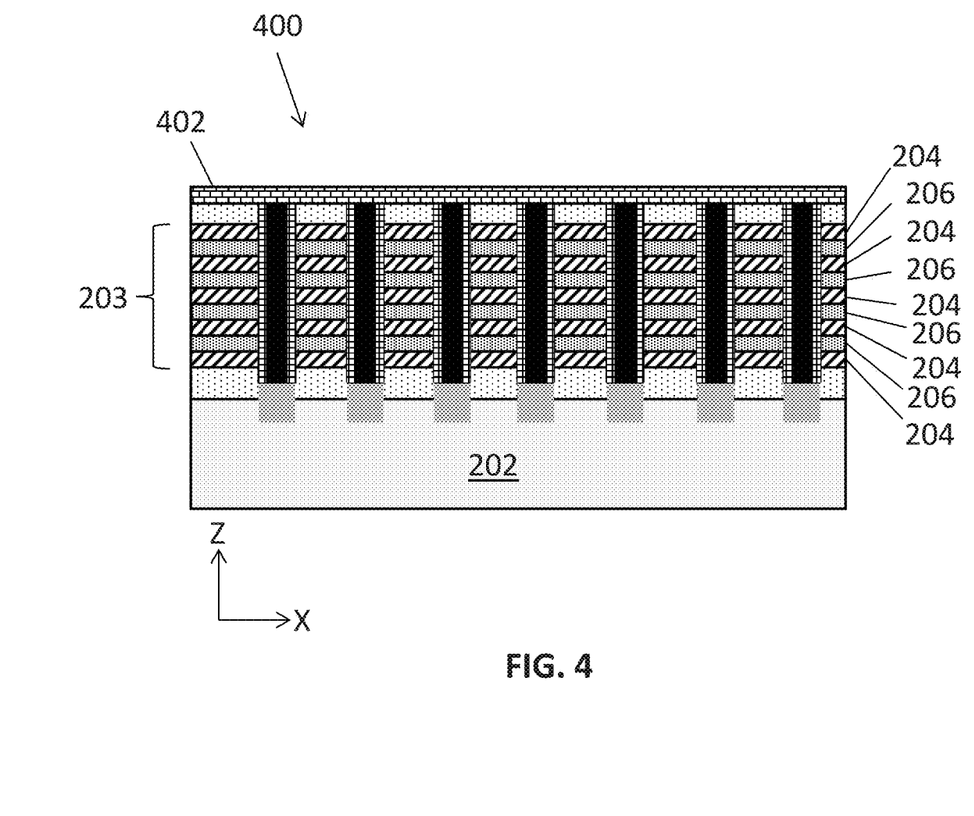
FIG. 4 illustrates a side cross-section view of a three-dimensional memory structure at a stage of an exemplary fabrication process, according to some embodiments.

FIG. 4 illustrates an exemplary structure 400 for forming the three-dimensional memory device, according to some embodiments. A silicon carbide (SiC) layer 402 is deposited on the top surface of structure 400 over layer stack 203, according to some embodiments. SiC layer 402 can be deposited using any suitable deposition technique. In one particular example, SiC layer 402 is deposited using plasma-enhanced chemical vapor deposition (PECVD). SiC layer 402 can be deposited to a thickness between about 10 nm and about 500 nm.

Figure 5:
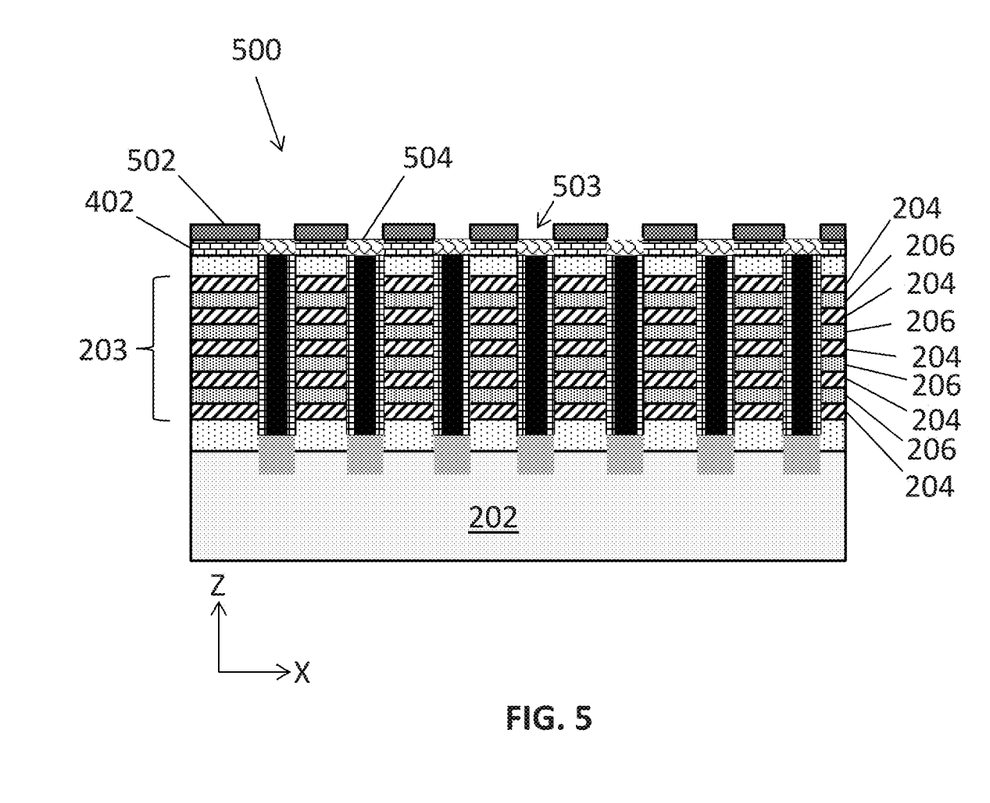
FIG. 5 illustrates a side cross-section view of a three-dimensional memory structure at a stage of an exemplary fabrication process, according to some embodiments.

FIG. 5 illustrates an exemplary structure 500 for forming the three-dimensional memory device, according to some embodiments. A mask layer 502 is deposited over SiC layer 402 and patterned to form openings 503 within mask layer 502, according to some embodiments. Mask layer 502 can be a photoresist, in which the patterning is performed using standard lithography techniques. In other examples, mask layer 502 can be a hard mask layer of nitride or oxide.

According to some embodiments, the exposed portions of SiC layer 402 beneath openings 503 are doped to form doped regions 504. Doped regions 504 have a higher conductivity compared to un-doped regions of SiC layer 402. In some embodiments, doped regions 504 are doped with carbon.

Figure 6:
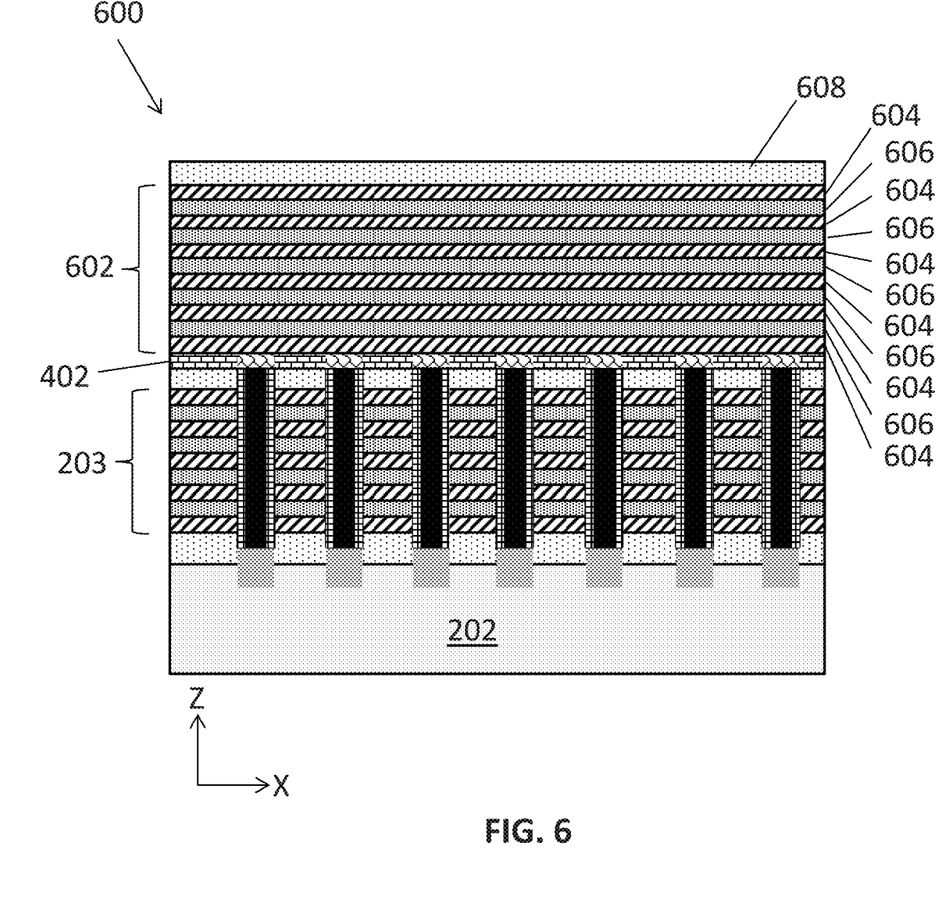
FIG. 6 illustrates a side cross-section view of a three-dimensional memory structure at a stage of an exemplary fabrication process, according to some embodiments.

FIG. 6 illustrates an exemplary structure 600 for forming the three-dimensional memory device, according to some embodiments. Mask layer 502 is removed and a second alternating sacrificial/dielectric layer stack 602 is formed over SiC layer 402. The layer stack 602 includes dielectric layers 604 alternating with sacrificial layers 606. The formation of layer stack 602 can involve depositing sacrificial layers 606 to each have the same thickness or to have different thicknesses. Example thicknesses of sacrificial layers 606 can range from 20 nm to 500 nm. Similarly, dielectric layers 604 can each have the same thickness or have different thicknesses. Example thicknesses of dielectric layers 604 can range from 20 nm to 500 nm. Another dielectric material 608 is deposited over layer stack 602. Dielectric material 608 has the same material composition of dielectric layers 604, according to some embodiments.

The dielectric material of sacrificial layers 606 is different from the dielectric material of dielectric layers 604, according to an embodiment. For example, each of sacrificial layers 606 can be silicon nitride while each of dielectric layers 604 can be silicon dioxide. Other example materials for each of sacrificial layers 606 include poly-crystalline silicon, poly-crystalline germanium, and poly-crystalline germanium-silicon. The dielectric materials used for any of dielectric layers 604 or sacrificial layers 606 can include silicon oxide, silicon nitride, silicon oxynitride, or any combination thereof. Although only eleven total layers are illustrated in layer stack 602, it should be understood that this is for illustrative purposes only and that any number of dielectric layers may be included in layer stack 602.

Layer stack 602 can include a portion having a staircase structure (not illustrated) where each of at least sacrificial layers 606 terminate at a different length in the horizontal 'x' direction. This staircase structure allows for electrical contact to connect each of the word lines of the memory device.

Figure 7:
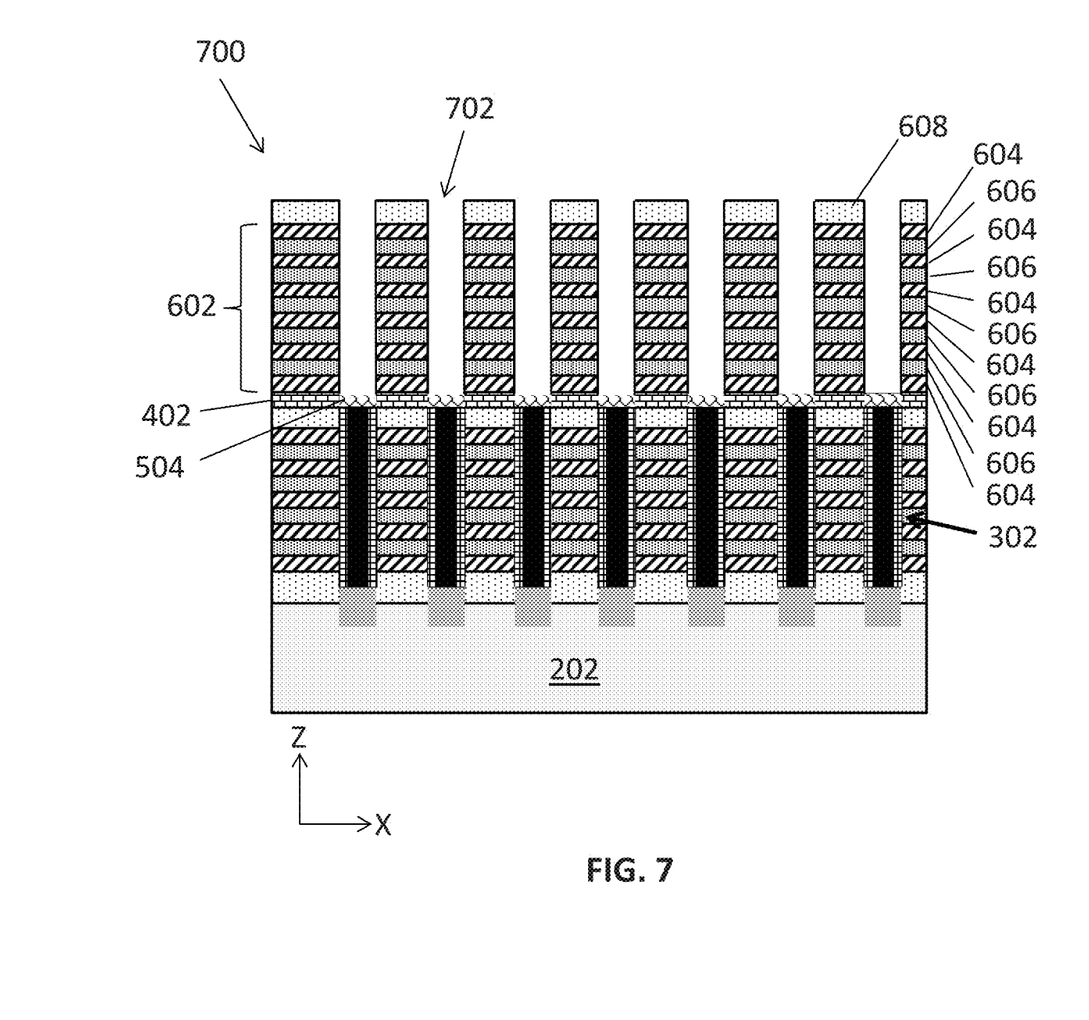
FIG. 7 illustrates a side cross-section view of a three-dimensional memory structure at a stage of an exemplary fabrication process, according to some embodiments.

FIG. 7 illustrates an exemplary structure 700 for forming the three-dimensional memory device, according to some embodiments. One or more openings 702 are etched through layer stack 602 and down to doped regions 504 of SiC layer 502. One or more openings 702 can be substantially aligned with corresponding ones of one or more first vertical structures 302. One or more openings 702 can be formed using a deep reactive ion etching (DRIE) process or an inductively coupled plasma (ICP) process. A dielectric or photoresist layer may be deposited and patterned to form a mask layer during the etching of one or more openings 702. It should be understood that one or more openings 702 are illustrated as having vertical sidewalls for ease of illustration only, and that one or more openings 702 can instead have sloped or tapered sidewalls.

Figure 8:
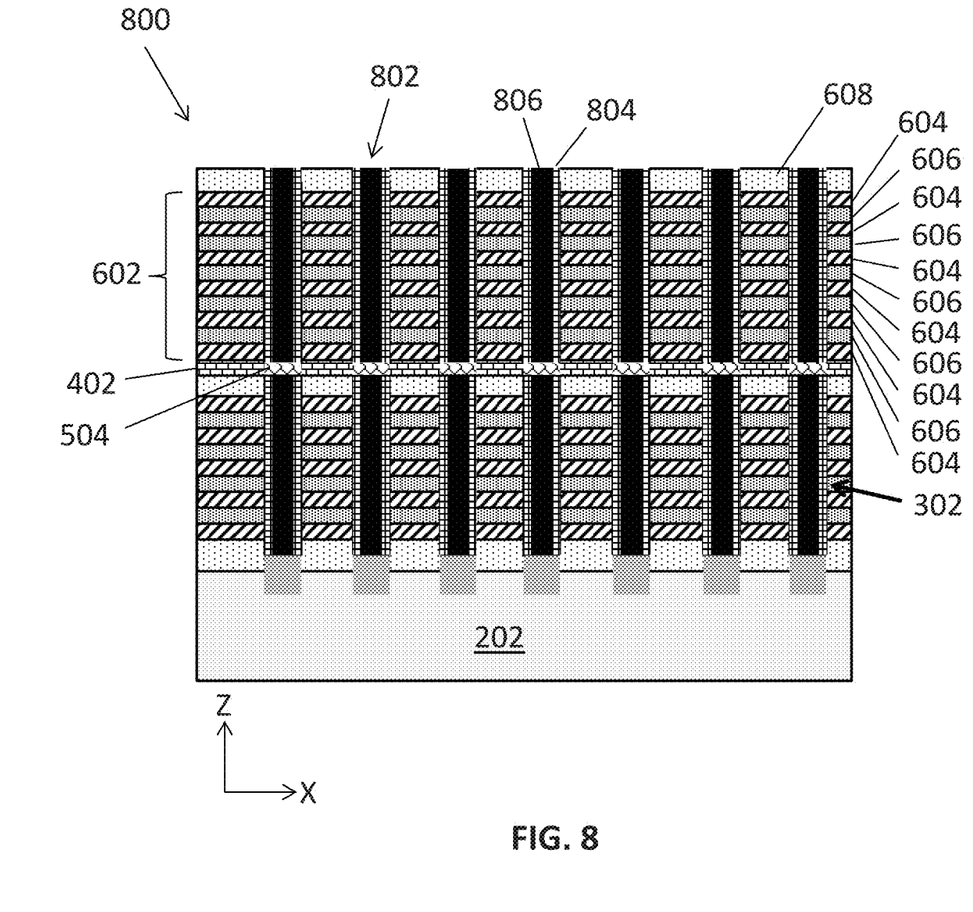
FIG. 8 illustrates a side cross-section view of a three-dimensional memory structure at a stage of an exemplary fabrication process, according to some embodiments.

FIG. 8 illustrates an exemplary structure 800 for forming the three-dimensional memory device, according to some embodiments. One or more second vertical structures 802 are formed within one or more openings 702. One or more second vertical structures 802 includes a plurality of memory layers 804 and an insulating core 806. According to some embodiments, one or more second vertical structures 802 are NAND strings. One or more second vertical structures 802 can be formed in substantially the same way as one or more first vertical structures 302. In some embodiments, a conductive path is formed between one or more first vertical structures 302 and one or more second vertical structures 802 via doped regions 504.

Insulating core 806 can be any dielectric material, such as oxide, for example. Plurality of memory layers 804 can include a semiconductor channel layer, such as amorphous silicon, polysilicon, or single crystalline silicon. Plurality of memory layers 804 can also include a tunneling layer, a storage layer (also known as "charge trap/storage layer"), and a blocking layer. The semiconductor channel layer, the tunneling layer, the storage layer, and the blocking layer are arranged over one another on the sidewalls of one or more openings 702 in the order listed, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 804 includes silicon oxide/silicon nitride/silicon oxide (ONO) dielectrics (e.g., a tunneling layer including silicon oxide, a storage layer including silicon nitride, and a blocking layer including silicon oxide). Each layer of plurality of memory layers 804 can be deposited using any suitable thin film deposition technique.

Figure 9:
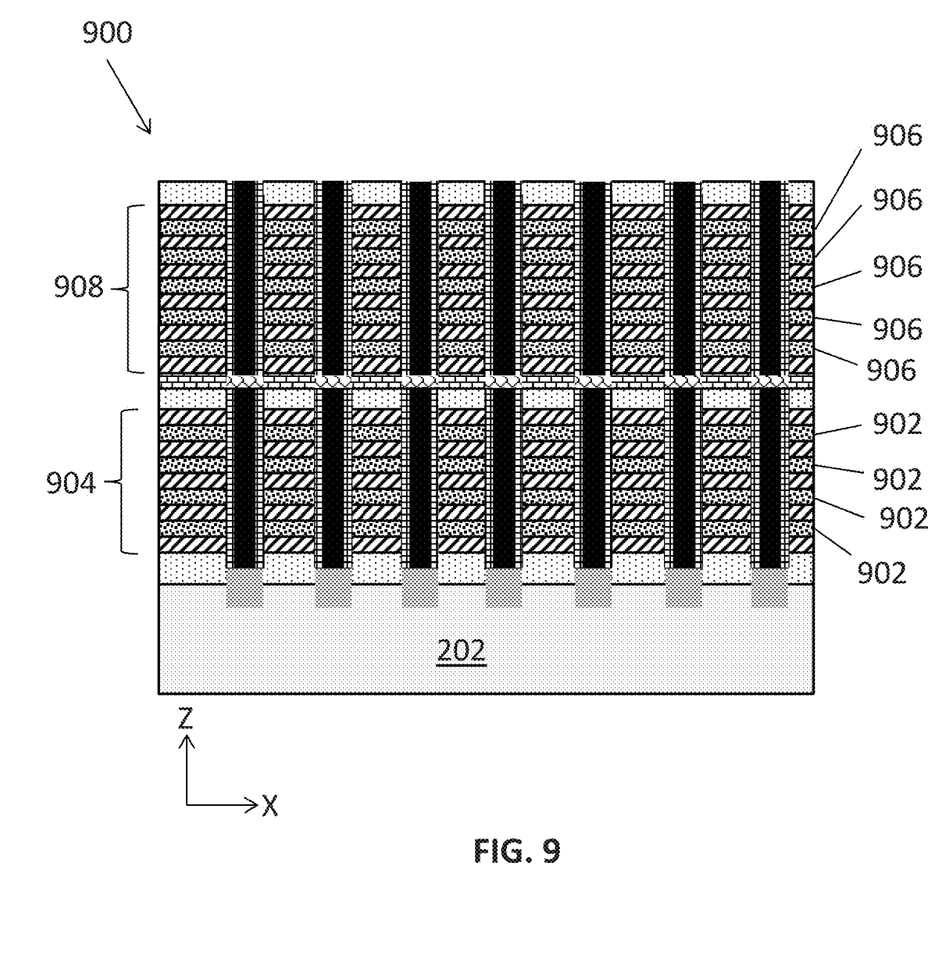
FIG. 9 illustrates a side cross-section view of a three-dimensional memory structure at a stage of an exemplary fabrication process, according to some embodiments.

FIG. 9 illustrates an exemplary structure 900 for forming the three-dimensional memory device, according to some embodiments. Sacrificial layers 206 of layer stack 203 are removed and replaced with conductor layers 902 to form alternating dielectric/conductor layer stack 904. Similarly, sacrificial layers 606 of layer stack 602 are removed and replaced with conductor layers 906 to form alternating dielectric/conductor layer stack 908. The sacrificial layers from both layer stack 203 and layer stack 602 can be removed together during the same removal process. Similarly, conductor layers 902 and conductor layers 906 can be deposited together during the same process.

Sacrificial layers 206/606 can be removed by a suitable etching process, e.g., an isotropic dry etch or a wet etch. The etching process can have sufficiently high etching selectivity of the material of sacrificial layers 206/606 over the materials of other parts of structure 900, such that the etching process can have minimal impact on the other parts of structure 900. In some embodiments, sacrificial layers 206/606 include silicon nitride and the etchant of the isotropic dry etch includes one or more of $CF_4$, $CHF_3$, $C_4F_8$, $C_4F_6$, and $CH_2F_2$. The radio frequency (RF) power of the isotropic dry etch can be lower than about 100 W and the bias can be lower than about 10 V. In some embodiments, sacrificial layers 206/606 include silicon nitride and the etchant of the wet etch includes phosphoric acid.

Conductor layers 902/906 can include conductor materials including, but not limited to, W, Co, Cu, Al, doped silicon, silicides, or any combination thereof. Each of conductor layers 902/906 can be deposited into the regions left behind by the removal of sacrificial layers 206/606 using a suitable deposition method such as CVD, sputtering, MOCVD, and/or ALD.

Figure 10:
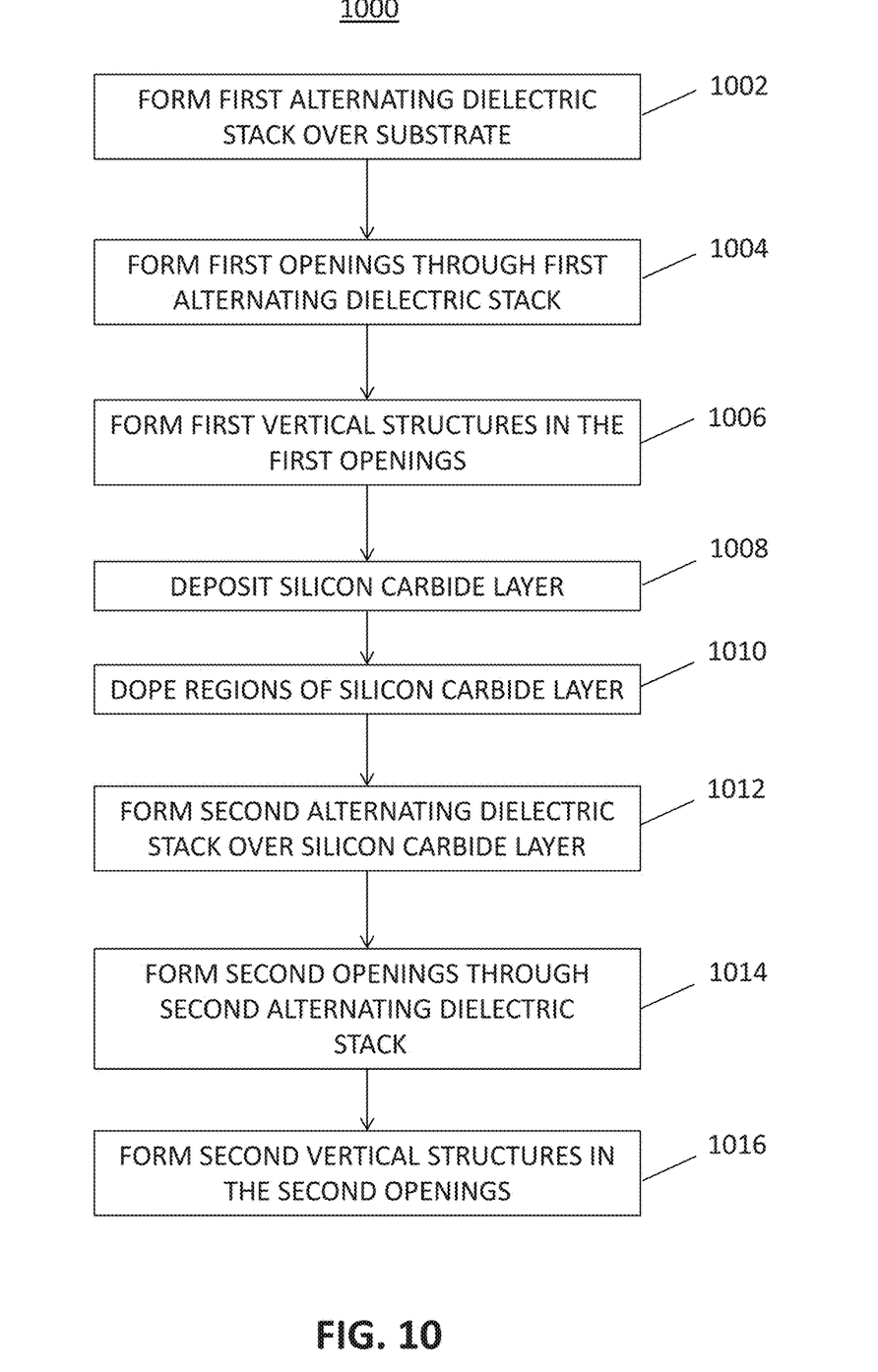
FIG. 10 is an illustration of a fabrication process for forming a three-dimensional memory structure, according to some embodiments.

FIG. 10 is a flowchart of an exemplary method 1000 for forming a NAND memory device, according to some embodiments. The operations of method 1000 are generally illustrated in FIGS. 2-9. It should be understood that the operations shown in method 1000 are not exhaustive and that other operations can be performed as well before, after, or between any of the illustrated operations. In various embodiments of the present disclosure, the operations of method 1000 can be performed in a different order and/or vary.

In operation 1002, a first alternating dielectric stack is formed over a substrate. The first alternating dielectric stack may include sacrificial dielectric layers alternating with dielectric layers having a different material composition. The layers of the first alternating dielectric stack can include materials including, but not limited to, silicon oxide, silicon nitride, silicon oxynitride, or any combination thereof. The layers of the first alternating dielectric stack can include dielectric materials deposited by one or more thin film deposition processes including, but not limited to, CVD, PVD, ALD, or any combination thereof.

According to some embodiments, the layers of the first alternating dielectric stack have a staircase structure where each of at least the sacrificial layers terminate at a different length in a horizontal direction over the surface of the substrate. This staircase structure allows for electrical contact to connect each of the word lines of the memory device.

In operation 1004, one or more first openings are etched through the alternating dielectric stack, thus exposing a surface of the substrate. The one or more first openings may be formed using any suitable dry etching technique, including deep reactive ion etching (DRIE) or inductively coupled plasma (ICP) etching, to name a few examples. In some embodiments, a material is epitaxially grown at the bottom of the one or more first openings on the exposed substrate. The epitaxially grown material may be epitaxially grown silicon.

In operation 1006, one or more first vertical structures are formed within the one or more first openings. In some embodiments, the one or more first vertical structures are NAND strings. Forming the one or more first vertical structures can include first forming a plurality of memory layers over the sidewalls of the one or more first openings. Forming the plurality of memory layers can include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more first openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide).

After formation of the plurality of memory layers, a remainder of the one or more first openings may be filled with an insulating material. The insulating material may be any dielectric material, such as oxide, for example.

In operation 1008, a SiC layer is formed over the first alternating dielectric stack. The SiC layer can be deposited using any suitable deposition technique. In one particular example, the SiC layer is deposited using plasma-enhanced chemical vapor deposition (PECVD). The SiC layer can be deposited to a thickness between about 10 nm and about 500 nm.

In operation 1010, regions of the SiC layer are doped to provide higher conductivity in the doped regions. A mask layer can be patterned over the SiC layer to expose regions of the SiC layer substantially aligned over the one or more first vertical structures. The exposed regions of the SiC layer can be doped using carbon, for example, to enhance the conductivity of the exposed regions of the SiC layer.

In operation 1012, a second alternating dielectric stack is formed over the SiC layer. The second alternating dielectric stack may include sacrificial dielectric layers alternating with dielectric layers having a different material composition. The layers of the second alternating dielectric stack can include materials including, but not limited to, silicon oxide, silicon nitride, silicon oxynitride, or any combination thereof. The layers of the second alternating dielectric stack can include dielectric materials deposited by one or more thin film deposition processes including, but not limited to, CVD, PVD, ALD, or any combination thereof.

According to some embodiments, the layers of the second alternating dielectric stack have a staircase structure where each of at least the sacrificial layers terminate at a different length in a horizontal direction over the surface of the substrate. This staircase structure allows for electrical contact to connect each of the word lines of the memory device.

In operation 1014, one or more second openings are etched through the second alternating dielectric stack. The one or more second openings may be substantially aligned with the one or more first vertical sacrificial structures formed in the one or more first openings. The one or more second openings may extend deep enough to expose the doped regions of the SiC layer. The one or more second openings may be formed to have substantially the same diameter or cross-sectional shape as the one or more first vertical structures. The one or more second openings may be formed using any suitable dry etching technique, including deep reactive ion etching (DRIE) or inductively coupled plasma (ICP) etching, to name a few examples.

In operation 1016, one or more second vertical structures are formed within the one or more second openings. In some embodiments, the one or more second vertical structures are NAND strings. The one or more second vertical structures can form a conductive pathway with the one or more first vertical structures via the doped regions of the SiC layer.

Forming the one or more second vertical structures can include first forming a plurality of memory layers over the sidewalls of the one or more second openings. Forming the plurality of memory layers can include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more second openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide).

After formation of the plurality of memory layers, a remainder of the one or more second openings may be filled with an insulating material. The insulating material may be any dielectric material, such as oxide, for example.

In some embodiments, the sacrificial layers of the first alternating dielectric stack and the second alternating dielectric stack can be removed and replaced by conductor layers to form a first alternating conductor/dielectric stack and a second alternating conductor/dielectric stack, respectively. The sacrificial layers of the first alternating dielectric stack may be removed at a different time than the sacrificial layers of the second alternating dielectric stack. In some embodiments, the sacrificial layers of both the first alternating dielectric stack and the second alternating dielectric stack are removed during the same process.

The present disclosure describes various embodiments of three-dimensional NAND memory device and methods of making the same. In some embodiments, a NAND memory device includes a substrate having a plurality of recess in a surface of the substrate. An epitaxially-grown material is formed in the plurality of recesses. The memory device includes a first alternating conductor/dielectric stack disposed on the substrate and a layer of silicon carbide disposed over the first alternating conductor/dielectric stack. A second alternating conductor/dielectric stack is disposed on the silicon carbide layer. The memory device includes one or more first structures extending orthogonally with respect to the surface of the substrate through the first alternating conductor/dielectric stack and over the epitaxially-grown material disposed in the plurality of recesses, and one or more second structures extending orthogonally with respect to the surface of the substrate through the second alternating conductor/dielectric stack. The one or more second structures are substantially aligned over corresponding ones of the one or more first structures.

In some embodiments, the method to form the three-dimensional memory device includes forming a first alternating sacrificial dielectric stack over a substrate, and forming one or more first openings through the first alternating sacrificial dielectric stack, the one or more first openings forming corresponding recesses in the substrate. The method includes forming a material in the corresponding recesses and forming one or more first vertical structures in the one or more first openings. The method further includes forming a silicon carbide layer over the first alternating sacrificial dielectric stack. The method also includes forming a second alternating sacrificial dielectric stack over the silicon carbide, and forming one or more second openings through the second alternating sacrificial dielectric stack. The one or more second openings are aligned with the one or more first vertical structures. The method also includes forming one or more second vertical structures in the one or more second openings.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the statements and guidance presented herein. It is to be understood that the phraseology or terminology herein is for the purpose of description and not of limitation, such that the terminology or phraseology of the present specification is to be interpreted by the skilled artisan in light of the statements and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a substrate having a plurality of recess in a surface of the substrate;
   an epitaxially-grown material formed in the plurality of recesses;
   a first layer stack disposed on the substrate, the first layer stack comprising alternating conductor layers and dielectric layers;
   a silicon carbide layer disposed on a top surface of the first layer stack;
   a second layer stack disposed over the silicon carbide layer, the second layer stack comprising alternating conductor layers and dielectric layers;
   one or more first structures extending orthogonally with respect to the surface of the substrate through the first layer stack and over the epitaxially-grown material disposed in the plurality of recesses; and
   one or more second structures extending orthogonally with respect to the surface of the substrate through the second layer stack, the one or more second structures being substantially aligned over corresponding ones of the one or more first structures.

2. The memory device of claim 1, wherein the one or more first structures comprises one or more NAND strings.

3. The memory device of claim 2, wherein the one or more second structures comprises one or more NAND strings.

4. The memory device of claim 3, wherein each of the one or more NAND strings comprises an inner semiconductor channel and one or more outer dielectric layers.

5. The memory device of claim 4, wherein the one or more outer dielectric layers includes at least one oxide layer and at least one nitride layer.

6. The memory device of claim 1, wherein the silicon carbide layer includes one or more doped regions substantially aligned over the one or more first structures.

7. The memory device of claim 6, wherein the one or more doped regions are doped with carbon.

8. The memory device of claim 1, wherein the silicon carbide layer has a thickness between 10 nm and 500 nm.

9. The memory device of claim 1, wherein the first layer stack and the second layer stack each include alternating layers of oxide and tungsten.

10. The memory device of claim 1, wherein the first layer stack and the second layer stack are arranged in a staircase pattern.

11. A method for forming a memory device, comprising:
    forming a first layer stack over a substrate, the first layer stack having alternating sacrificial and dielectric layers;
    forming one or more first openings through the first layer stack, the one or more first openings forming corresponding recesses in the substrate;
    forming a material in the corresponding recesses;
    forming one or more first vertical structures in the one or more first openings;
    forming a silicon carbide layer on a top surface of the first layer stack;
    forming a second layer stack over the silicon carbide layer, the second layer stack having alternating sacrificial and dielectric layers;
    forming one or more second openings through the second layer stack, the one or more second openings being aligned with the one or more first vertical structures; and
    forming one or more second vertical structures in the one or more second openings.

12. The method of claim 11, wherein forming the material comprises forming epitaxially grown silicon in the corresponding recesses.

13. The method of claim 11, further comprising:
    removing the sacrificial layers from the first layer stack and the second layer stack, and replacing the removed sacrificial layers with conductive layers.

14. The method of claim 13, wherein the removing the sacrificial layers comprises removing nitride layers from the first layer stack and the second layer stack, and wherein the replacing comprises replacing the nitride layers with tungsten.

15. The method of claim 11, wherein forming the one or more first vertical structures comprises forming one or more NAND strings.

16. The method of claim 15, wherein forming the one or more second vertical structures comprises forming one or more NAND strings.

17. The method of claim 16, wherein forming the one or more NAND strings of the first and second vertical structures comprises forming one or more outer dielectric layers and forming a semiconductor channel.

18. The method of claim 17, wherein forming one or more outer dielectric layers comprises forming at least one oxide layer and at least one nitride layer.

19. The method of claim 11, wherein forming the silicon carbide layer comprises doping one or more regions of the silicon carbide layer, the one or more regions being substantially aligned over corresponding ones of the one or more first vertical structures.

20. The method of claim 19, wherein the doping comprises doping the one or more regions of the silicon carbide layer with carbon.

21. The method of claim 11, wherein forming the silicon carbide layer comprises forming the silicon carbide layer using plasma-enhanced chemical vapor deposition (PECVD).

22. The method of claim 11, further comprising:
after forming the silicon carbide layer, annealing the memory device.

* * * * *